United States Patent
Shimizu et al.

(10) Patent No.: US 7,911,113 B1
(45) Date of Patent: Mar. 22, 2011

(54) PIEZOELECTRIC/ELECTROSTRICTIVE ELEMENT AND METHOD OF MANUFACTURING PIEZOELECTRIC/ELECTROSTRICTIVE ELEMENT

(75) Inventors: Hideki Shimizu, Oobu (JP); Shinji Shiranita, Komaki (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/552,326

(22) Filed: Sep. 2, 2009

(51) Int. Cl.
*H01L 41/08* (2006.01)

(52) U.S. Cl. .................. 310/324; 310/332; 310/367

(58) Field of Classification Search .......... 310/324, 310/328, 330–332; 347/68–70
See application file for complete search history.

(56) References Cited

U.S. PATENT DOCUMENTS

| | | | |
|---|---|---|---|
| 5,814,920 A * | 9/1998 | Takeuchi et al. | 310/330 |
| 7,009,328 B2 * | 3/2006 | Kitagawa et al. | 310/363 |
| 7,019,438 B2 * | 3/2006 | Takahashi et al. | 310/324 |
| 7,019,441 B2 * | 3/2006 | Kashiwaya | 310/330 |
| 7,067,961 B2 * | 6/2006 | Takahashi et al. | 310/330 |
| 7,425,790 B2 * | 9/2008 | Nanataki et al. | 310/324 |
| 7,535,154 B2 * | 5/2009 | Umeda et al. | 310/320 |
| 7,642,695 B2 * | 1/2010 | Fujii | 310/320 |
| 2004/0051422 A1 * | 3/2004 | Kashiwaya et al. | 310/324 |
| 2004/0256953 A1 | 12/2004 | Kitagawa et al. | |
| 2006/0032034 A1 | 2/2006 | Kitagawa et al. | |
| 2006/0158068 A1 | 7/2006 | Shimizu et al. | |

FOREIGN PATENT DOCUMENTS

| | | |
|---|---|---|
| JP | 2000-246888 | 9/2000 |
| JP | 2005-12200 | 1/2005 |
| JP | 2006-202990 | 8/2006 |
| JP | 2006-202990 A1 | 8/2006 |
| JP | 2008-117794 | 5/2008 |

\* cited by examiner

*Primary Examiner* — Mark Budd
(74) *Attorney, Agent, or Firm* — Burr & Brown

(57) ABSTRACT

A piezoelectric/electrostrictive element having a double-layer structure in which a lower layer electrode film, a lower layer piezoelectric/electrostrictive film, an inner layer electrode film, an upper layer piezoelectric/electrostrictive film and an upper layer electrode film are laminated in this order on a thin portion of a substrate. In the piezoelectric/electrostrictive element, a driving signal is applied between an outer layer electrode film and the inner layer electrode film, whereby the thin portion and a laminate can be subjected to bending vibration. The piezoelectric/electrostrictive film has film thickness distribution in which a film thickness becomes larger in a continuous manner from a center portion of a bending vibration region which is an antinode of a bending first mode toward an edge portion of the bending vibration region which is a node of the bending first mode, along a short side direction of the bending vibration region.

7 Claims, 20 Drawing Sheets

F I G . 1
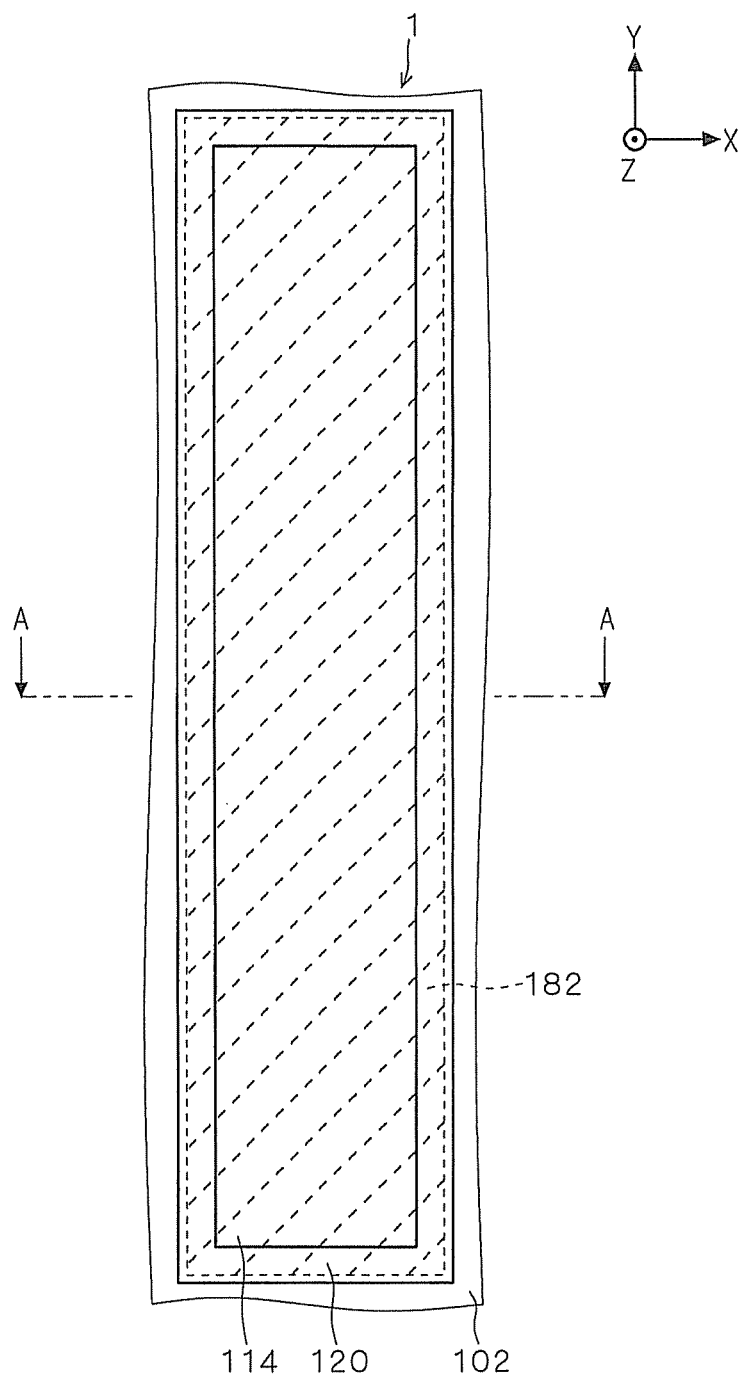

F I G . 2
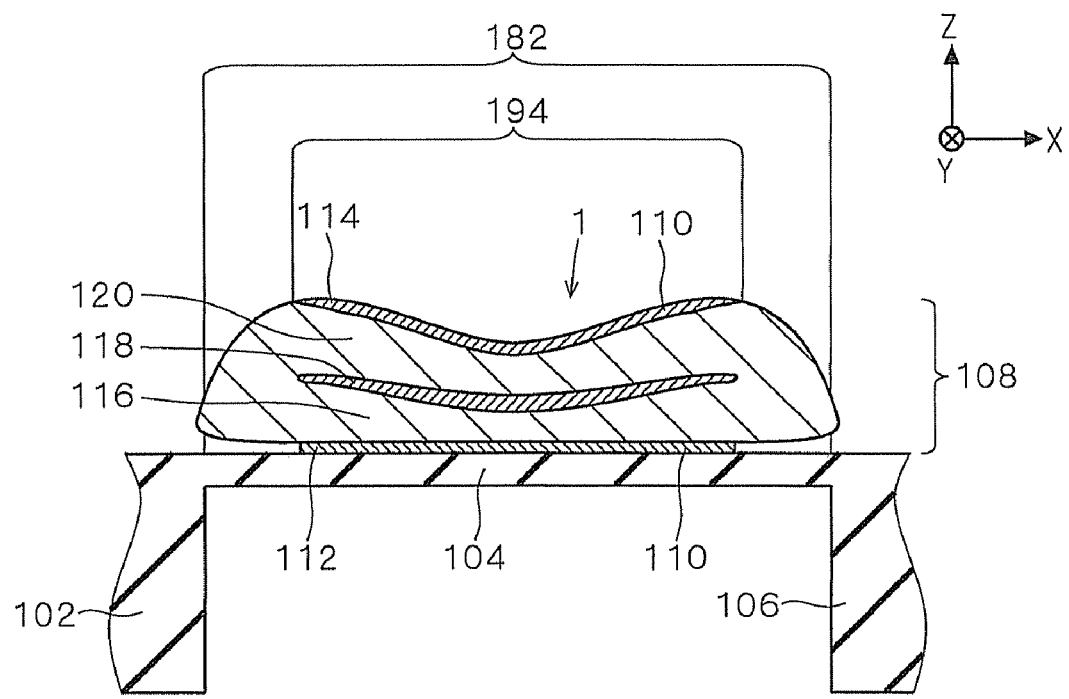

F I G . 6
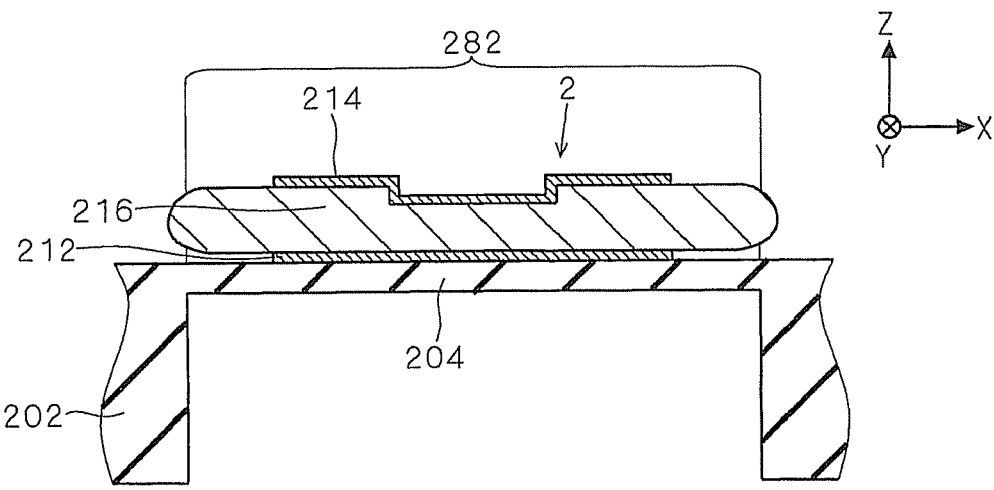
F I G . 7
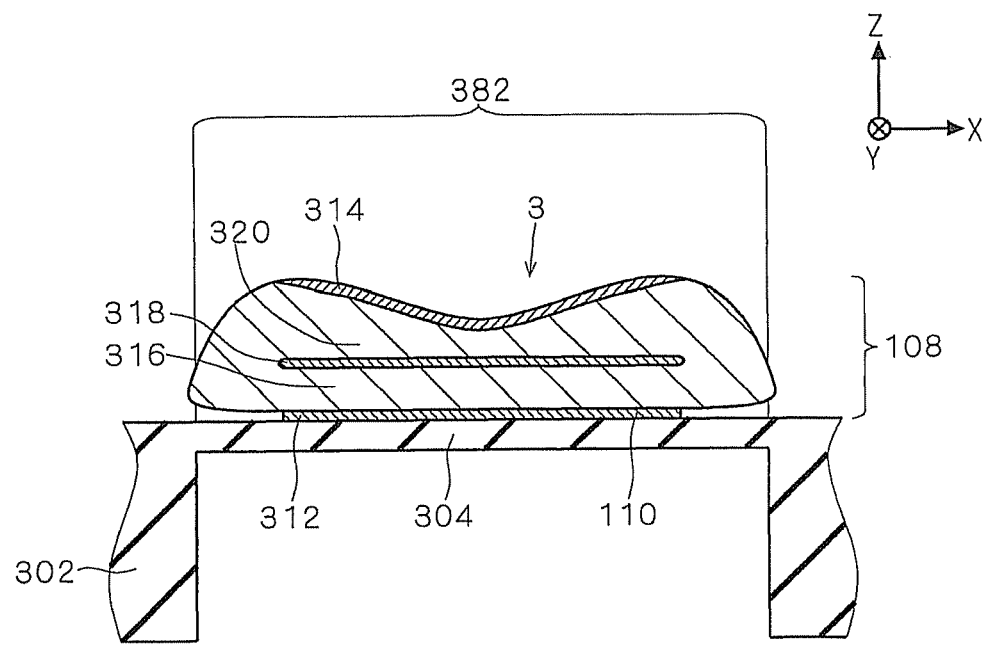

F I G . 1 4
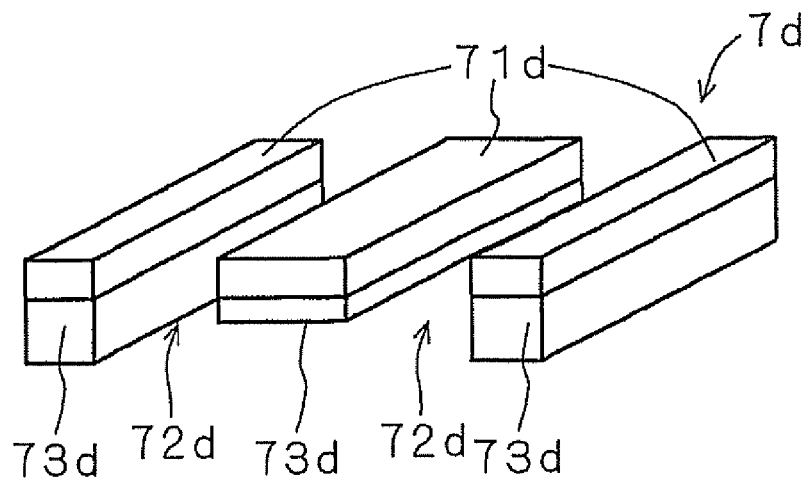
F I G . 1 5
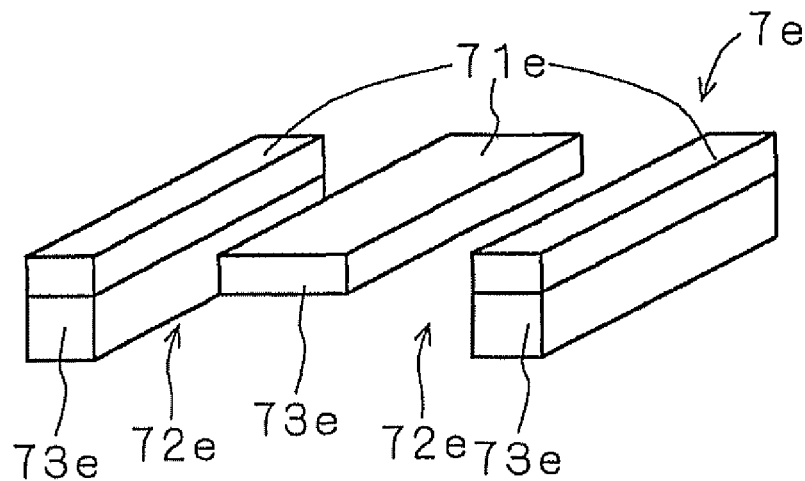

F I G . 1 6
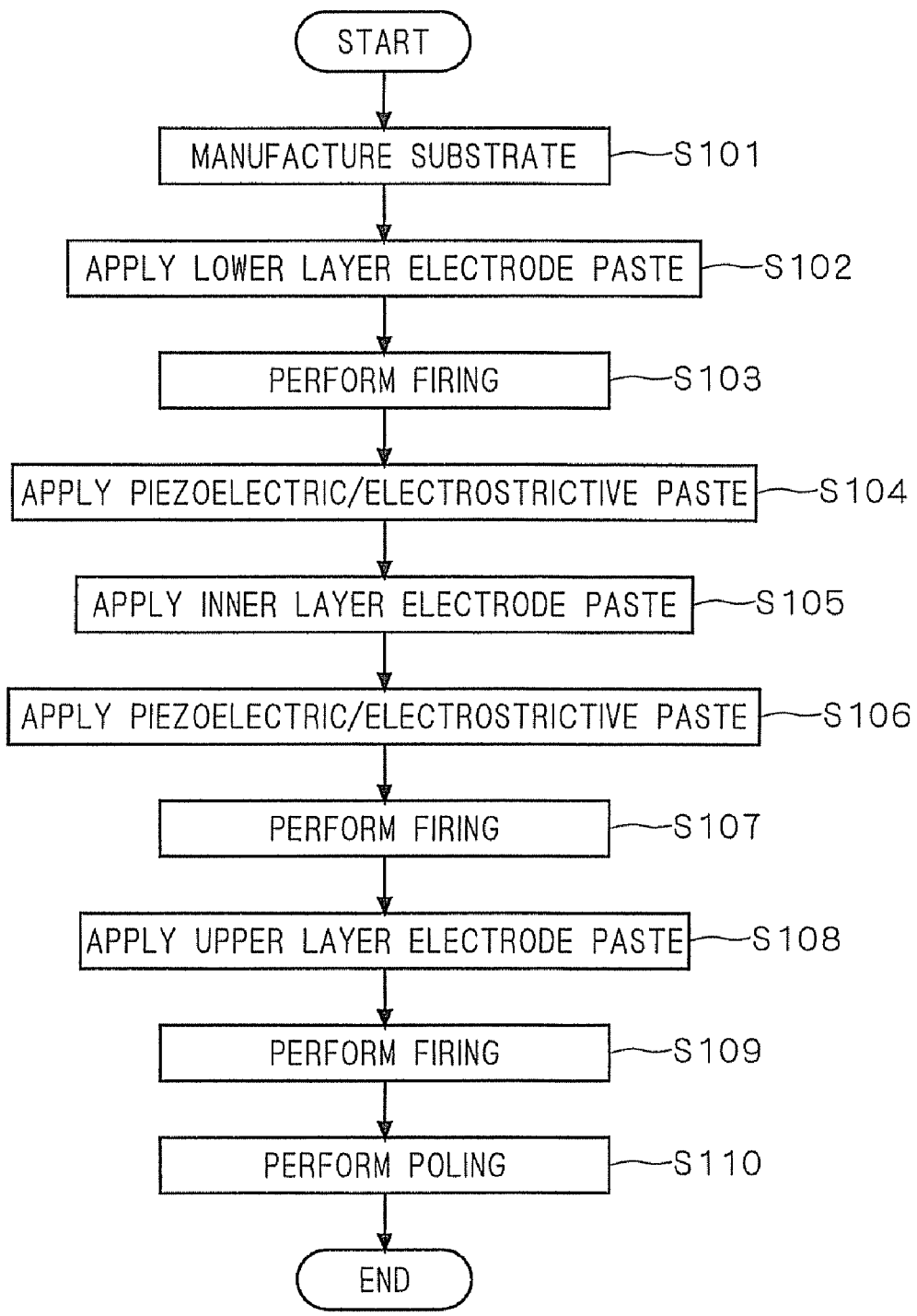

FIG. 17

| | FILM THICKNESS TA AT EDGE PORTION | FILM THICKNESS TE AT CENTER PORTION | DISPLACEMENT AMOUNT ($\mu m$) | INSULATING PROPERTIES |
|---|---|---|---|---|
| COMPARATIVE EXAMPLE 1 | 0.70 | 1.00 | 0.328 | × |
| INVENTIVE EXAMPLE 1 | 1.01 | 1.00 | 0.355 | ○ |
| INVENTIVE EXAMPLE 2 | 1.10 | 1.00 | 0.356 | ○ |
| INVENTIVE EXAMPLE 3 | 1.50 | 1.00 | 0.358 | ○ |
| INVENTIVE EXAMPLE 4 | 2.00 | 1.00 | 0.359 | ○ |
| INVENTIVE EXAMPLE 5 | 2.50 | 1.00 | 0.362 | ○ |
| INVENTIVE EXAMPLE 6 | 3.00 | 1.00 | 0.362 | ○ |
| INVENTIVE EXAMPLE 7 | 4.00 | 1.00 | 0.344 | △ |

F I G. 1 8

| | FILM THICKNESS TA AT EDGE PORTION | FILM THICKNESS TC AT CENTER POINT | FILM THICKNESS TE AT CENTER PORTION | DISPLACEMENT AMOUNT($\mu m$) | INSULATING PROPERTIES |
|---|---|---|---|---|---|
| INVENTIVE EXAMPLE 8 | 0.70 | 1.01 | 1.00 | 0.347 | ○ |
| INVENTIVE EXAMPLE 9 | 0.70 | 1.10 | 1.00 | 0.348 | ○ |
| INVENTIVE EXAMPLE 10 | 0.70 | 1.50 | 1.00 | 0.345 | ○ |
| INVENTIVE EXAMPLE 11 | 0.70 | 2.00 | 1.00 | 0.352 | ○ |
| INVENTIVE EXAMPLE 12 | 0.70 | 2.50 | 1.00 | 0.348 | ○ |
| INVENTIVE EXAMPLE 13 | 0.70 | 3.00 | 1.00 | 0.340 | ○ |
| INVENTIVE EXAMPLE 14 | 0.70 | 4.00 | 1.00 | 0.322 | △ |

FIG. 19

| | FILM THICKNESS TA AT EDGE PORTION | FILM THICKNESS TC AT CENTER POINT | FILM THICKNESS TM AT LARGEST FILM THICKNESS POINT | LARGEST FILM THICKNESS POINT | DISPLACEMENT AMOUNT ($\mu m$) | INSULATING PROPERTIES |
|---|---|---|---|---|---|---|
| INVENTIVE EXAMPLE 3 | 0.70 | 1.00 | 1.50 | A | 0.358 | ○ |
| INVENTIVE EXAMPLE 15 | 0.70 | 1.00 | 1.50 | B | 0.350 | ○ |
| INVENTIVE EXAMPLE 10 | 0.70 | 1.00 | 1.50 | C | 0.345 | ○ |
| INVENTIVE EXAMPLE 16 | 0.70 | 1.00 | 1.50 | D | 0.325 | × |

FIG. 20

| | FILM THICKNESS TA AT EDGE PORTION | FILM THICKNESS TE AT CENTER PORTION | DISPLACEMENT AMOUNT (μm) | INSULATING PROPERTIES |
|---|---|---|---|---|
| INVENTIVE EXAMPLE 3 | 1.50 | 1.00 | 0.358 | ○ |
| INVENTIVE EXAMPLE 17 | 1.10 | 1.00 | 0.359 | ○ |
| INVENTIVE EXAMPLE 18 | 1.10 | 1.00 | 0.350 | ○ |
| COMPARATIVE EXAMPLE 2 | 0.80 | 1.00 | 0.224 | × |

F I G . 2 1

| | THICKNESS RATIO BETWEEN PIEZOELECTRIC/ELECTROSTRICTIVE FILMS | DISPLACEMENT AMOUNT ($\mu$m) | INSULATING PROPERTIES |
|---|---|---|---|
| COMPARATIVE EXAMPLE 3 | 0.7 | 0.166 | × |
| INVENTIVE EXAMPLE 19 | 1.01 | 0.181 | ○ |
| INVENTIVE EXAMPLE 20 | 1.1 | 0.201 | ○ |
| INVENTIVE EXAMPLE 21 | 1.5 | 0.205 | ○ |
| INVENTIVE EXAMPLE 22 | 2 | 0.21 | ○ |
| INVENTIVE EXAMPLE 23 | 2.5 | 0.205 | ○ |
| INVENTIVE EXAMPLE 24 | 3 | 0.207 | ○ |
| INVENTIVE EXAMPLE 25 | 3.5 | 0.21 | △ |
| INVENTIVE EXAMPLE 26 | 4 | 0.205 | △ |

PIEZOELECTRIC/ELECTROSTRICTIVE ELEMENT AND METHOD OF MANUFACTURING PIEZOELECTRIC/ELECTROSTRICTIVE ELEMENT

FIELD OF THE INVENTION

The present invention relates to a piezoelectric/electrostrictive element and a method of manufacturing a piezoelectric/electrostrictive element.

BACKGROUND OF THE INVENTION

A piezoelectric/electrostrictive actuator has an advantage that displacement can be controlled in a submicron order with accuracy. In particular, a piezoelectric/electrostrictive actuator, in which a sintered body of a piezoelectric/electrostrictive ceramic composition is used, has advantages such as high electromechanical conversion efficiency, large generating force, high response speed, high durability and less power consumption, in addition to the advantage that displacement can be controlled with accuracy. Thanks to these advantages, the piezoelectric/electrostrictive actuator is used in a head of an inkjet printer, an injector of a diesel engine, a hydraulic servo valve, a head of VTR, a pixel of a piezoelectric ceramic display and the like.

An example of the conventional piezoelectric/electrostrictive actuator as described above will be described with reference to FIG. 30. FIG. 30 is a schematic view of a conventional piezoelectric/electrostrictive element 8 used as an actuator in a head of an inkjet printer, which is a cross-sectional view of the piezoelectric/electrostrictive element 8.

As shown in FIG. 30, the piezoelectric/electrostrictive element 8 has a structure in which a lower layer electrode film 812, a lower layer piezoelectric/electrostrictive film 816, an inner layer electrode film 818, an upper layer piezoelectric/electrostrictive layer 820 and an upper layer electrode film 814 are laminated in this order on a thin portion 804 of a substrate 802. In the piezoelectric/electrostrictive element 8, a driving signal is applied between an outer layer electrode film (lower layer electrode film 812 and upper layer electrode film 814) 810 and the inner layer electrode film 818, whereby the thin portion 804 and a laminate 808, which is composed the lower layer electrode film 812, the lower layer piezoelectric/electrostrictive film 816, the inner layer electrode film 818, the upper layer piezoelectric/electrostrictive film 820 and the upper layer electrode film 814, can be subjected to bending vibration.

Japanese Patent Application Laid-Open No. 2006-202990 is a prior art reference related to a conventional piezoelectric/electrostrictive element. Japanese Patent Application Laid-Open No. 2006-202990 discloses a piezoelectric/electrostrictive element in which a film thickness of a piezoelectric/electrostrictive film is uniform (see FIG. 9) and a piezoelectric/electrostrictive element in which a film thickness of a piezoelectric/electrostrictive film continuously becomes thinner from a center portion thereof toward an edge portion thereof (see FIG. 10).

However, in the conventional piezoelectric/electrostrictive element, a displacement amount becomes insufficient in some cases. In addition, there arises a problem that, when the film thickness of the piezoelectric/electrostrictive film is made thinner overall for increasing the displacement amount, dielectric breakdown is likely to occur at high humidity at an edge portion of an operating region in which electrode films are opposed to each other with the piezoelectric/electrostrictive film being sandwiched therebetween.

SUMMARY OF THE INVENTION

According to a first aspect of the present invention, a piezoelectric/electrostrictive element includes: a substrate including a thin portion surrounded by a thick portion; and a laminate formed on the substrate, in which a piezoelectric/electrostrictive film and electrode films are laminated, wherein the thin portion and the laminate are subjected to bending vibration, and wherein along a short side direction of a bending vibration region being a direction of a straight line passing through an antinode of a bending first mode when the straight line crossing the bending vibration region has a smallest length, a part or all of the piezoelectric/electrostrictive film has film thickness distribution in which a portion having a larger film thickness than the antinode of the bending first mode between the antinode and a node of the bending first mode.

Accordingly, it is possible to increase, in the piezoelectric/electrostrictive element, a displacement amount while preventing dielectric breakdown occurring at an edge portion of an operating region at high humidity.

According to a second aspect of the present invention, a piezoelectric/electrostrictive element includes: a substrate including a thin portion surrounded by a thick portion; and a laminate formed on the substrate, in which a piezoelectric/electrostrictive film and electrode films are laminated, wherein the thin portion and the laminate are subjected to bending vibration, and wherein along a short side direction of a bending vibration region being a direction of a straight line passing through an antinode of a bending first mode when the straight line crossing the bending vibration region has a smallest length, a part or all of the piezoelectric/electrostrictive film has film thickness distribution in which a portion in which a film thickness is larger than the antinode of the bending first mode is positioned between the antinode of the bending first mode and an edge portion of an operating region in which said electrode films are opposed to each other with said piezoelectric/electrostrictive film being sandwiched therebetween.

Accordingly, it is possible to, in the piezoelectric/electrostrictive element, increase a displacement amount while preventing dielectric breakdown occurring at the edge portion of the operating region at high humidity.

According to a third aspect of the present invention, a method of manufacturing a piezoelectric/electrostrictive element including: a substrate including a thin portion surrounded by a thick portion; and a laminate formed on the substrate, in which a piezoelectric/electrostrictive film and electrode films are laminated, the thin portion and the laminate being subjected to bending vibration, which includes the steps of: (a) printing a piezoelectric/electrostrictive paste; and (b) subjecting a film of the piezoelectric/electrostrictive paste obtained in the step (a) to firing, to thereby obtain, along a short side direction of a bending vibration region being a direction of a straight line passing through an antinode of a bending first mode when the straight line crossing the bending vibration region has a smallest length, the piezoelectric/electrostrictive film having film thickness distribution in which a portion whose film thickness is larger than the antinode of the bending first mode between the antinode and a node of the bending first mode, wherein in the step (a), a printing plate including a portion opposed to a portion in which a film thickness of the piezoelectric/electrostrictive film is larger than the antinode of the bending first mode in the printing is an opening, is used.

Accordingly, it is possible to form the piezoelectric/electrostrictive film with ease.

An object of the present invention is therefore to increase a displacement amount of a piezoelectric/electrostrictive element.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a piezoelectric/electrostrictive element according to a preferred embodiment;

FIG. 2 is a cross-sectional view of the piezoelectric/electrostrictive element according to the preferred embodiment;

FIG. 6 is a cross-sectional view of a piezoelectric/electrostrictive element according to another example;

FIG. 7 is a cross-sectional view of a piezoelectric/electrostrictive element according to another example;

FIG. 14 is a perspective view of a metal mask;

FIG. 15 is a perspective view of a metal mask;

FIG. 16 is a flowchart for describing a method of manufacturing a piezoelectric/electrostrictive element;

FIG. 17 is a table showing evaluation results of a displacement amount and insulating properties;

FIG. 18 is a table showing evaluation results of a displacement amount and insulating properties;

FIG. 19 is a table showing evaluation results of a displacement amount and insulating properties;

FIG. 20 is a table showing evaluation results of a displacement amount and insulating properties;

FIG. 21 is a table showing evaluation results of a displacement amount and insulating properties;

DETAILED DESCRIPTION OF THE INVENTION

Overall Structure of Piezoelectric/Electrostrictive Element

Figure 3:
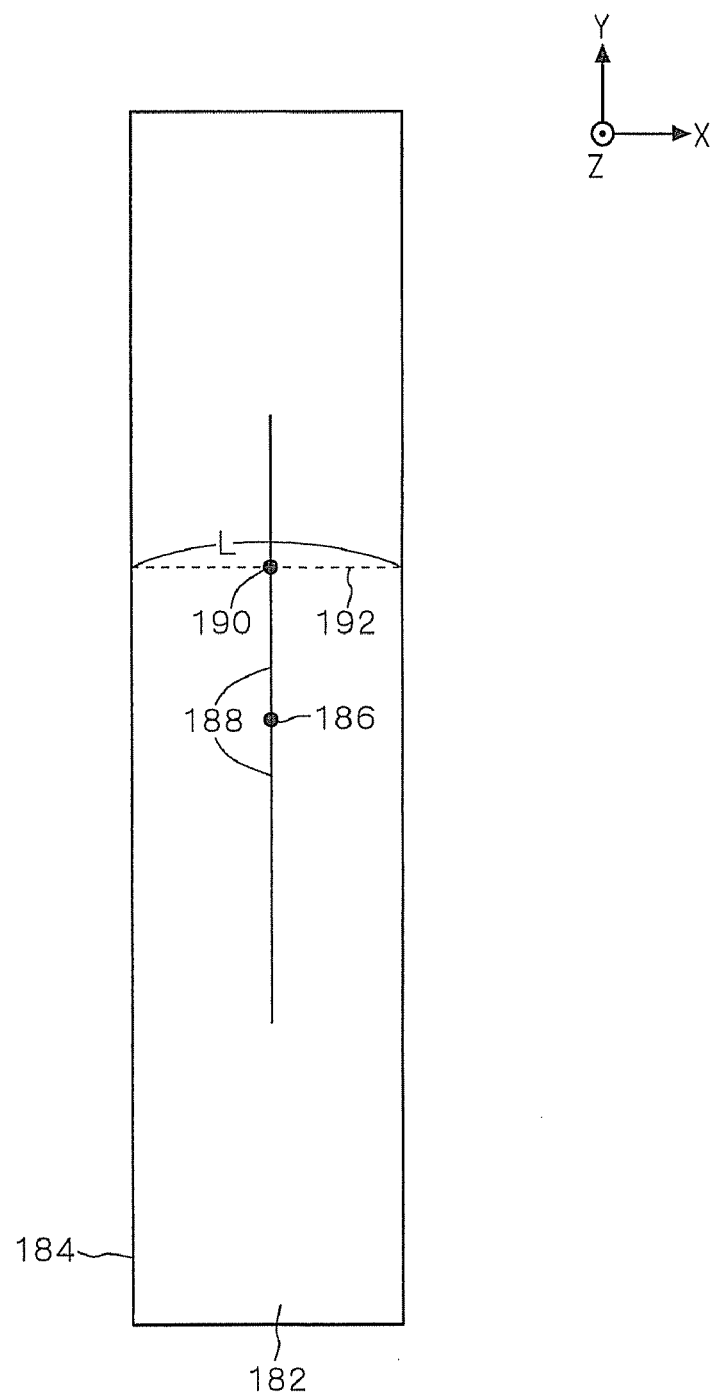
FIG. 3 is a plan view of a rectangular bending vibration region.

FIG. 1 and FIG. 2 are schematic views of main parts of a piezoelectric/electrostrictive element 1 according to a preferred embodiment of the present invention. FIG. 1 is a plan view of the piezoelectric/electrostrictive element 1, and FIG. 2 is a cross-sectional view of the piezoelectric/electrostrictive element 1, which is taken along a section line A-A of FIG. 1. In FIG. 1 and FIG. 2, for the sake of convenience of description, there is defined an XYZ orthogonal coordinate system in which a short side direction of a bending vibration region 182 is an X axis direction and a long side direction thereof is an Y axis direction, which will be described below.

The piezoelectric/electrostrictive element 1 shown in FIG. 1 and FIG. 2 is an actuator used in a head of an inkjet printer. Note that this fact does not prevent the present invention from being applied to a piezoelectric/electrostrictive element other than the actuator used in the head of the inkjet printer. For example, the present invention is applicable to various actuators and sensors.

As shown in FIG. 2, the piezoelectric/electrostrictive element 1 has a double-layer structure in which a lower layer electrode film 112, a lower layer piezoelectric/electrostrictive film 116, an inner layer electrode film 118, an upper layer piezoelectric/electrostrictive film 120 and an upper layer electrode film 114 are laminated in this order on a thin portion 104 of a substrate 102. The piezoelectric/electrostrictive element 1 includes an operating region 194 to which an electric filed is applied and a non-operating region to which the electric filed is not applied.

FIG. 2 shows a case where a laminate 108 formed on the substrate 102, in which the lower layer electrode film 112, the lower layer piezoelectric/electrostrictive film 116, the inner layer electrode film 118, the upper layer piezoelectric/electrostrictive film 120 and the upper layer electrode film 114 are laminated, includes one layer of the inner layer electrode film 118. However, the present invention is also applicable to a case where the laminate 108 includes two or more layers of the inner layer electrode films 118 and a case where the laminate 108 does not include the inner layer electrode film 118. In addition, FIG. 2 shows a case where the laminate 108 is formed directly on the substrate 102, but the laminate 108 may be formed indirectly on the substrate 102 via an inactive layer. Further, a plurality of piezoelectric/electrostrictive elements 1 can be regularly arranged at constant intervals, to thereby be used integrally.

(Bending Vibration Region)

In the piezoelectric/electrostrictive element 1, a driving signal is applied between outer layer electrode films (lower layer electrode film 112 and upper layer electrode film 114) 110 and the inner layer electrode film 118, with the result that the thin portion 104 and the laminate 108 can be subjected to bending vibration. Hereinafter, a region in which this bending vibration is excited is referred to as a "bending vibration region". In FIG. 1, a bending vibration region 182 is indicated by leftward-sloping dashed-line hatching. An outer edge of a part indicated by the leftward-sloping dashed-line hatching in FIG. 1 is located at a boundary between a thick portion 106 and the thin portion 104.

In the piezoelectric/electrostrictive element 1, a shape in plan view of the thin portion 104, that is, a shape in plan view of the bending vibration region 182 is rectangular. In this case, as shown in a plan view of FIG. 3, an edge portion 184 of the bending vibration region 182 is a node of a bending first mode, and a line segment 188 extending from a center 186 of the bending vibration region 182 toward both sides of the bending vibration region 182 in the long side direction is an antinode of the bending first mode. It goes without saying that the shape in plan view of the bending vibration region 182 is not limited to be rectangular, and may be elliptical as shown in a plan view of FIG. 4 or hexagonal as shown in a plan view of FIG. 5. Also in the cases where the shape in plan view of the bending vibration region 182 is elliptical as shown in FIG. 4 and hexagonal as shown in FIG. 5, the edge portion 184 of the bending vibration region 182 is the node of the bending first mode, and the line segment 188 extending from the center 186 of the bending vibration region 182 toward the both sides of the bending vibration region 182 in the long side direction is the antinode of the bending first mode. Note that, in a case where the shape in plan view of the bending vibration region 182 becomes more complicated, the "line segment" is not necessarily the antinode of the bending first mode, whereas a vicinity of the center portion of the bending vibration region 182 is the antinode of the bending first mode in the same manner. Also in FIG. 3 to FIG. 5, there is defined an XYZ orthogonal coordinate system in which a short side direction of the bending vibration region 182 is an X axis direction and a long side direction thereof is an Y axis direction.

The present invention is preferably applicable to a case where a length in the short side direction of the bending vibration region 182 having an elongated two-dimensional shape is equal to or less than 1,000 μm, more preferably applicable to a case where the length is equal to or less than 500 μm, and particularly preferably applicable to a case where the length is equal to or less than 300 μm. This is because, when the length in the short side direction of the bending vibration region 182 is long, the thin portion 104 directly held by the thick portion 106 is likely to deform, while the laminate 108 which is not directly held by the thick portion 106 is unlikely to deform to a large extent, and accordingly, the laminate 108 has a less effect on a degree that the thin portion 104 and the laminate 108 which are subjected to bending vibration are likely to deform as a whole. Accordingly, significance of using film thickness distribution of the piezoelectric/electrostrictive films 116 and 120, which will be described below, tends to be small. However, this does not mean that the present invention is not applicable to a case where the length in the short side direction of the bending vibration region 182 becomes longer than the above-mentioned length at all. Further, the length in the short side direction of the bending vibration region 182 is desirably equal to or more than 30 μm.

Figure 4:
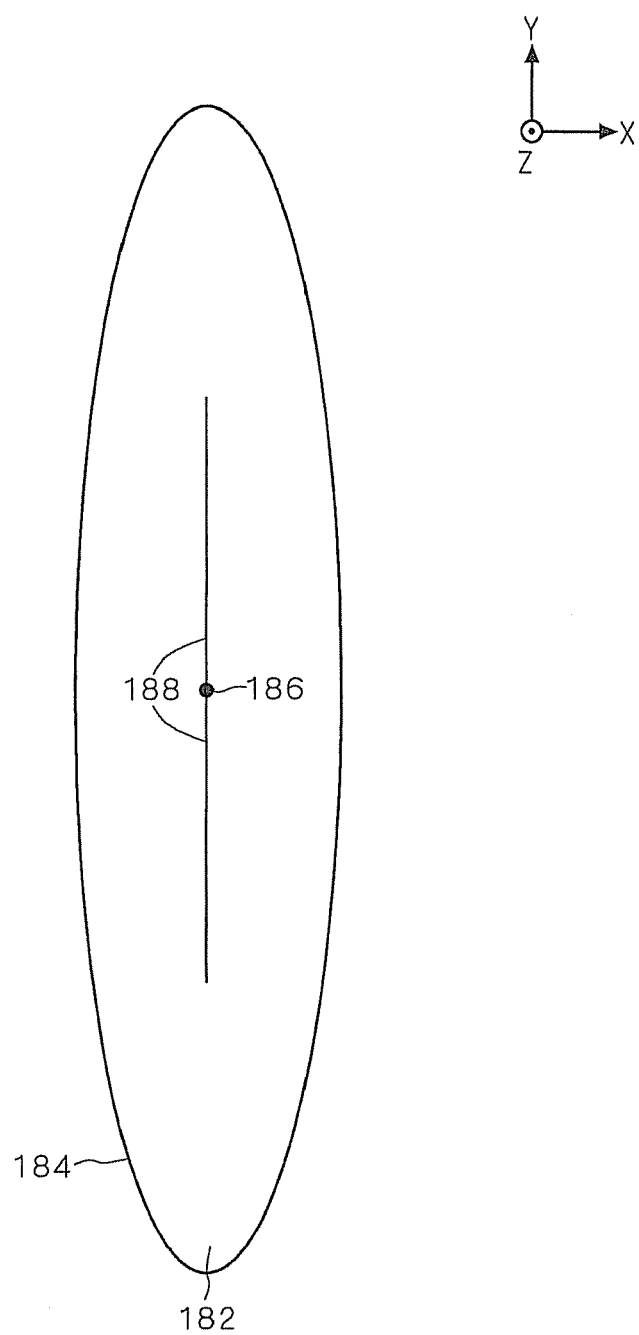
FIG. 4 is a plan view of an elliptical bending vibration region.
Figure 5:
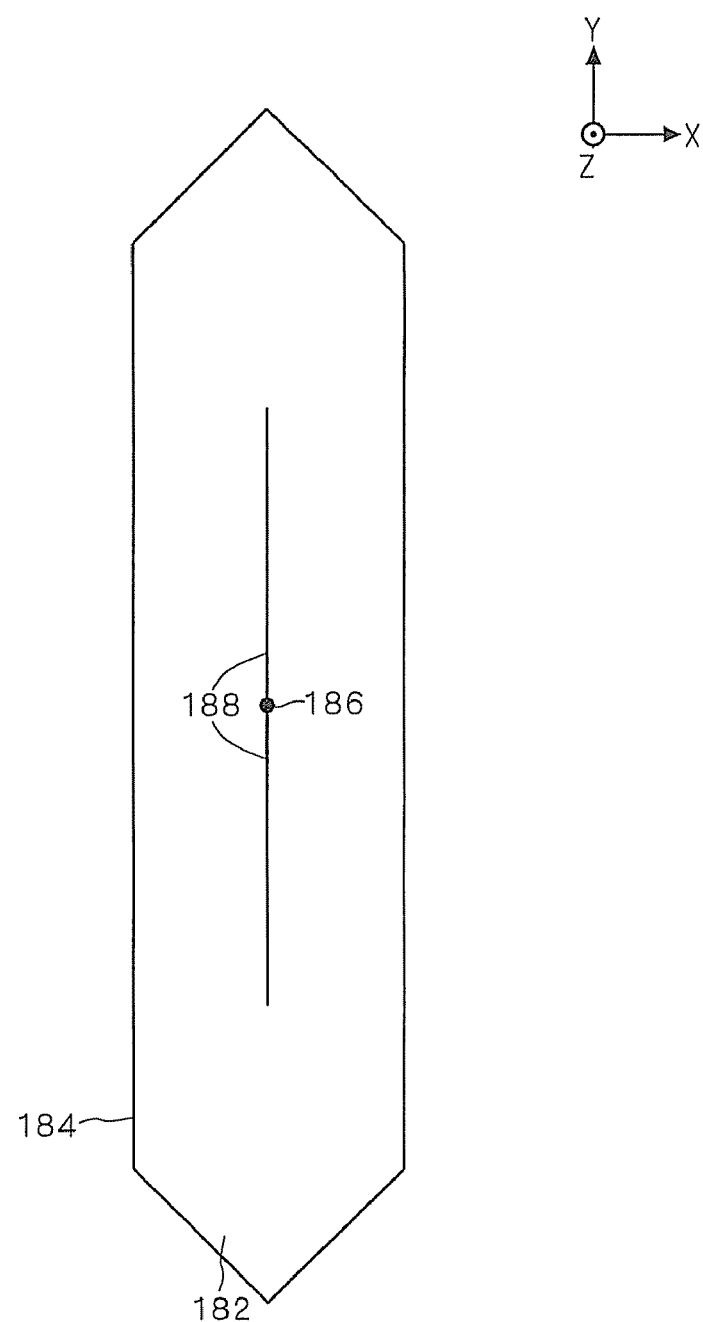
FIG. 5 is a plan view of a hexagonal bending vibration region.

The "short side direction" of the bending vibration region 182 is a short side direction of the rectangle in the case where the shape in plan view of the bending vibration region 182 is rectangular as shown in FIG. 3, and a short axis direction of the ellipse in the case where the shape in plan view of the bending vibration region 182 is elliptical as shown in FIG. 4. As shown in FIG. 3, the short side direction is generally a direction of a straight line 192 when a length L of the straight line 192 passing through a point 190 positioned on the antinode of the bending first mode crosses the bending vibration region 182 is the smallest. In the case where the shape in plan view of the bending vibration region 182 is rectangular, the straight line 192 is naturally perpendicular to the line segment 188.

(Substrate)

The substrate 102 is a sintered body made of an insulating material. As the insulating material, there is desirably used zirconium oxide ($ZrO_2$) to which a stabilizing agent such as calcium oxide (CaO), magnesium oxide (MgO), yttrium oxide ($Y_2O_3$), ytterbium oxide ($Yb_2O_3$) and cerium oxide ($Ce_2O_3$) is added, that is, stabilized zirconium oxide or partially stabilized zirconium oxide.

The substrate 102 has a cavity structure in which the thin portion 104 at the center thereof is surrounded and supported by the thick portion 106 on a circumference thereof. When the cavity structure is used so that the thin portion 104 having a small plate thickness is supported by the thick portion 106 having a large plate thickness, the plate thickness of the thin portion 104 can be made small while maintaining a mechanical strength of the substrate 102. As a result, it is possible to decrease rigidity of the thin portion 104, whereby a displacement amount of the piezoelectric/electrostrictive element 1 can be increased. The plate thickness of the thin portion 104 is desirably 1 μm or more and 15 μm or less. This is because the thin portion 104 is susceptible to damage if the plate thickness falls below this range. Meanwhile, the displacement amount of the piezoelectric/electrostrictive element 1 tends to decrease if the plate thickness exceeds this range.

(Piezoelectric/Electrostrictive Film)

The piezoelectric/electrostrictive films 116 and 120 are sintered bodies made of a piezoelectric/electrostrictive material. As the piezoelectric/electrostrictive material, lead (Pb)-based perovskite compound is desirably used. In particular, there is desirably used a binary compound of lead titanate ($PbTiO_3$) and lead zirconate ($PbZrO_3$), a ternary compound of lead titanate, lead zirconate and a third component, or a lead-based perovskite compound in which metal oxide is added to the binary or ternary compound. It is particularly desirable to use lead-based perovskite compound in which nickel oxide (NiO) is added to a ternary compound of lead titanate, lead zirconate and lead magnesium niobate ($Pb(Mg_{1/3}Nb_{2/3})O_3$). The piezoelectric/electrostrictive films 116 and 120 are desirably formed by forming a film using a screen printing method, and then subjecting the film to firing. It goes without saying that a film formation method such as a sol-gel method may be used in place of the screen printing method.

Firing temperature of the piezoelectric/electrostrictive films 116 and 120 is desirably 1,200° C. or more and 1,300° C. or less. The piezoelectric/electrostrictive films 116 and 120 tend not to become dense if the firing temperature is lower than 1,200° C., while the piezoelectric/electrostrictive films 116 and 120 are likely to be decomposed if the firing temperature is equal to or more than 1,300° C.

When the piezoelectric/electrostrictive films 116 and 120 are subjected to firing, in order to suppress the piezoelectric/electrostrictive films 116 and 120 from being decomposed, firing is desirably performed in a sagger whose material is magnesium oxide (MgO) or aluminum oxide ($Al_2O_3$). More desirably, firing is performed in a state in which a powder having the same composition as the piezoelectric/electrostrictive films 116 and 120 is contained in the sagger as an atmosphere adjustor.

An average film thickness of the piezoelectric/electrostrictive films 116 and 120 is desirably 2 μm or more and 15 μm or less. This is because insulating properties of the piezoelectric/electrostrictive films 116 and 120 tend to decrease if the average film thickness falls below this range, whereas the displacement amount of bending displacement tends to decrease if the average film thickness exceeds this range.

The piezoelectric/electrostrictive films 116 and 120 have film thickness distribution in which film thicknesses thereof become larger in a continuous manner from the center portion of the bending vibration region 182 which is the antinode of the bending first mode toward the edge portion of the bending vibration region 182 which is the node of the bending first mode, along the short side direction of the bending vibration region 182. When the film thickness distribution as described above is used, the film thicknesses of the piezoelectric/electrostrictive films 116 and 120 become larger at the edge portions of the outer layer electrode film 110 and the inner layer electrode film 118, whereby dielectric breakdown can be prevented. In addition, the film thicknesses of the piezoelectric/electrostrictive films 116 and 120 become smaller at the antinode of the bending first mode, and rigidity of the piezoelectric/electrostrictive films 116 and 120 decreases, with the result that the displacement amount of the piezoelectric/electrostrictive element 1 can be increased. It is effective to make the film thicknesses of the piezoelectric/electrostrictive films 116 and 120 larger at the edge portions of the outer layer electrode film 110 and the inner layer electrode film 118 because a likelihood of occurrence of dielectric breakdown tends to increase from the antinode of the bending first mode toward the edge portions of the outer layer electrode film 110 and the inner layer electrode film 118.

Note that, in order to obtain the effects as described above, it is sufficient that a part whose film thickness is larger than that of the center portion of the bending vibration region 182 is positioned between the center portion and the edge portion of the bending vibration region 182 in a case where the film thickness distribution of the piezoelectric/electrostrictive films 116 and 120 is viewed along the short side direction of the bending vibration region 182. Accordingly, the film thickness is not necessarily required to become larger "in a continuous manner", but may become larger "in a non-continuous manner" from a center portion of a bending vibration region 282 toward an edge portion of the bending vibration region 282, as shown in a schematic view of FIG. 6. FIG. 6 is a cross-sectional view of a piezoelectric/electrostrictive element 2 having a single-layer structure in which a lower layer electrode film 212, a piezoelectric/electrostrictive film 216 and an upper layer electrode film 214 are laminated in this order on a thin portion 204 of a substrate 202. Also in FIG. 6, there is defined an XYZ orthogonal coordinate system in which a short side direction of the bending vibration region 282 is an X axis direction and a long side direction thereof is an Y axis direction.

In order to effectively avoid dielectric breakdown, it is desirable to make the film thicknesses of the piezoelectric/electrostrictive films 116 and 120 the largest on the edge portion side of the operating region 194 with respect to a midpoint between the antinode of the bending first mode and the edge portion of the operating region 194 at which the outer layer electrode films 110 and the inner layer electrode film 118 are opposed to each other with the piezoelectric/electrostrictive films 116 and 120 being sandwiched therebetween.

In addition, for avoiding dielectric breakdown particularly effectively, it is desirable to make the film thicknesses of the piezoelectric/electrostrictive films 116 and 120 the largest at the edge portion of the operating region 194 at which the outer layer electrode films 110 and the inner layer electrode film 118 are opposed to each other with the piezoelectric/electrostrictive films 116 and the 120 being sandwiched therebetween.

Further, a ratio of the maximum value to the minimum value of the film thicknesses of the piezoelectric/electrostrictive films 116 and 120 is desirably 1.01 or more and 3.0 or less. If the ratio falls below this range, it is likely to be difficult to increase the displacement amount while avoiding dielectric breakdown. Meanwhile, if the ratio exceeds this range, the thickness at the center portion of the bending vibration region 182 becomes too small, and the electric field is concentrated at the center portion of the bending vibration region 182, whereby dielectric breakdown is likely to occur.

In the piezoelectric/electrostrictive element 1, all of a plurality of piezoelectric/electrostrictive films (lower layer piezoelectric/electrostrictive film 116 and upper layer piezoelectric/electrostrictive film 120) which are partitioned by the inner layer electrode film 118 have film thickness distribution in which the film thickness becomes larger in a continuous manner from the center portion toward the edge portion of the bending vibration region 182, along the short side direction of the bending vibration region 182. Note that, as shown in a schematic view of FIG. 7, the effect of increasing the displacement amount while preventing dielectric breakdown can be obtained even when only a part (in FIG. 7, upper layer piezoelectric/electrostrictive film 320) of a plurality of piezoelectric/electrostrictive films (lower layer piezoelectric/electrostrictive film 316 and upper layer piezoelectric/electrostrictive film 320) has film thickness distribution in which a film thickness becomes larger in a continuous manner from a center portion toward an edge portion of a bending vibration region 382, along a short side direction of a bending vibration region 382. FIG. 7 is a cross-sectional view of a piezoelectric/electrostrictive element 3 having a double-layer structure in which a lower layer electrode film 312, a lower layer piezoelectric/electrostrictive film 316, an inner layer electrode film 318, an upper layer piezoelectric/electrostrictive film 320 and an upper layer electrode film 314 are laminated in this order on a thin portion 304 of a substrate 302. Also in FIG. 7, there is defined an XYZ orthogonal coordinate system in which a short side direction of the bending vibration region 382 is an X axis direction and a long side direction thereof is an Y axis direction. Note that in the case where only a part of a plurality of piezoelectric/electrostrictive films has the above-mentioned film thickness distribution, the upper layer piezoelectric/electrostrictive film, which is the uppermost layer, desirably has the above-mentioned film thickness distribution. This is because the upper layer piezoelectric/electrostrictive film 320 being the uppermost layer is most likely to be affected by humidity.

Figure 8:
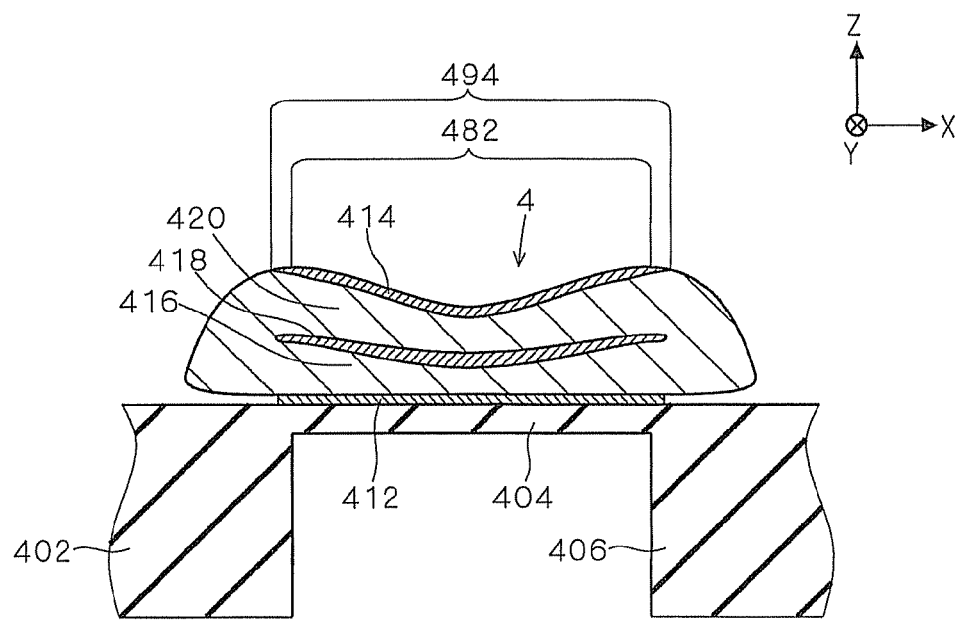
FIG. 8 is a cross-sectional view of a piezoelectric/electrostrictive element according to another example.

In addition, while the operating region 194 is contained in the bending vibration region 182 in the piezoelectric/electrostrictive element 1, as shown in a cross-sectional view of FIG. 8, an operating region 494 may extend beyond a bending vibration region 482. In this case, when film thickness distribution of piezoelectric/electrostrictive films 416 and 420 is viewed along a short side direction of the bending vibration region 482, it is sufficient that a part whose film thickness is larger than that of a center portion of the bending vibration region 482 is positioned between the center portion of the bending vibration region 482 and an edge portion of the operating region 494. FIG. 8 is a cross-sectional view of a piezoelectric/electrostrictive element 4 having a double-layer structure in which a lower layer electrode film 412, a lower layer piezoelectric/electrostrictive film 416, an inner layer electrode film 418, an upper layer piezoelectric/electrostrictive film 420 and an upper layer electrode film 414 are laminated in this order on a thin portion 404 of a substrate 402. Also in FIG. 8, there is defined an XYZ orthogonal coordinate system in which a short side direction of the bending vibration region 482 is an X axis direction and a long side direction thereof is an Y axis direction.

(Inner Layer Electrode Film)

The inner layer electrode film 118 is a sintered body of platinum or an alloy containing platinum as a main component. It goes without saying that the inner layer electrode film 118 can be formed of other conductive material as long as the material can be subjected to cofiring.

The inner layer electrode film 118 desirably has a film thickness of 0.5 μm or more and 3.0 μm or less. This is because disconnection tends to occur in the inner layer electrode film 118 during the cofiring if the film thickness falls below this range, whereas the displacement amount tends to decrease if the film thickness exceeds this range.

The inner layer electrode film 118 is also desirably formed by forming a film by a screen printing method, and then subjecting the film to firing. It goes without saying that a film formation method other than the screen printing method may be used.

(Outer Layer Electrode Film)

The outer layer electrode film 112 is desirably a sintered body of platinum (Pt) to which titanium oxide ($TiO_2$) is added. It goes without saying that a conductive material other than platinum to which titanium oxide is added may be used.

The outer layer electrode film 114 is desirably a sintered body of gold (Au). It goes without saying that a conductive material other than gold may be used.

The outer layer electrode films 112 and 114 are desirably formed by forming a film by the screen printing method, and then subjecting the film to firing. It goes without saying that the film formation method other than the screen printing method may be used.

(Formation of Piezoelectric/Electrostrictive Film by Screen Printing Method)

In order to form the piezoelectric/electrostrictive films 116 and 120 having the above-mentioned film thickness distribution on a flat film forming surface by the screen printing method, screen printing may be repeated a plurality of times. For example, a first screen mask whose non-center portion is filled with an emulsion and whose center portion is an opening is used, and a piezoelectric/electrostrictive body in a paste form is subjected to screen printing at the center portion. Then, a second screen mask 5 whose center portion 51 is filled with an emulsion 501 and whose non-center portion 52 is an opening may be used, and a piezoelectric/electrostrictive body in a paste form may be subjected to screen printing at a non-center portion 52. Through the screen printing as described above, the emulsion 501 of the second screen mask 5 is brought into contact with the piezoelectric/electrostrictive body at the center portion 51 which has been subjected to screen printing, whereby a printing surface of the second screen mask 5 becomes higher than a printing surface of the first screen mask. Accordingly, it is possible to obtain a piezoelectric/electrostrictive film having a film thickness larger than the center portion 51 at the non-center portion 52.

Here, if viscosity of the paste of the piezoelectric/electrostrictive body used in screen printing is reduced, a step between the center portion and the non-center portion becomes smooth, and the piezoelectric/electrostrictive film which "becomes thicker in a continuous manner" described above can be obtained. On the other hand, if the viscosity is increased, the piezoelectric/electrostrictive film which "becomes thicker in a non-continuous manner" described above can be obtained.

Figure 9:
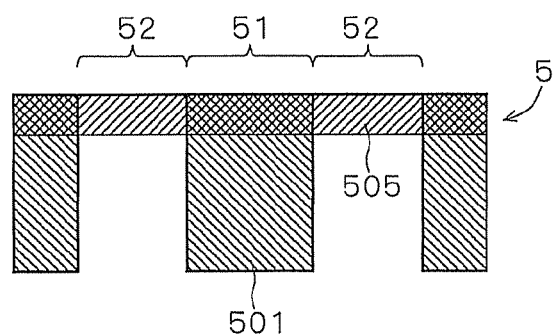
FIG. 9 is a cross-sectional view of a screen mask.
Figure 10:
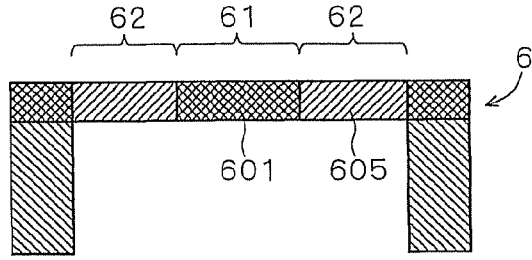
FIG. 10 is a cross-sectional view of a screen mask.

Further, in place of the screen mask 5 in which the emulsion 501 filling the center portion 51 projects from a screen mesh 505 toward the printing surface as shown in the cross-sectional view of FIG. 9, there may be used a screen mask 6 in which an emulsion 601 filling a center potion 61 does not project from a screen mesh 605, as shown in a cross-sectional view of FIG. 10. According to the screen mask 6 shown in the cross-sectional view of FIG. 10, a paste of a piezoelectric/electrostrictive body which has infiltrated from a non-center portion 62 being an opening can flow into the center portion 61 filled with the emulsion 601, and hence continuity of film thicknesses of piezoelectric/electrostrictive films to be formed is likely to be ensured.

Note that in place of performing the screen printing at the center portion once and the screen printing at the non-center portion once, the screen may be repeated at the center portion two or more times printing, or the screen printing at the non-center portion may be repeated two or more times.

Besides, in place of performing the screen printing at the center portion and then performing the screen printing at the non-center portion, the screen printing at the center portion may be performed after the screen printing at the non-center portion, or the screen printing at the center portion and the screen printing at the non-center portion may be performed alternately. In the latter case, the screen printing may be performed at the center portion two or more times, or the screen printing may be performed at the non-center portion two or more times.

Further, in place of performing the screen printing in two divided regions of the center portion and the non-center portion, the screen printing can be performed in three or more divided regions.

Note that in a case where the screen printing is performed using a metal mask without a screen mesh, a squeegee which is formed of a urethane resin or the like and has low hardness is used, whereby the center portion which is an opening can be scooped out. Accordingly, the piezoelectric/electrostrictive films 116 and 120 having the above-mentioned film thickness distribution can be formed by one screen printing. Further, when a squeegee having high hardness is used, a piezoelectric/electrostrictive film having a flat surface can be formed. Therefore, it is possible to form the piezoelectric/electrostrictive films 116 and 120 having the above-mentioned film thickness distribution on a film forming surface having a convex center portion by one screen printing in the same manner. In those cases, if a metal mask to which an emulsion is added is used, it is possible to suppress troubles such as blurring. Accordingly, the piezoelectric/electrostrictive films 116 and 120 having the above-mentioned film thickness distribution can be formed stably.

Besides, also in the case where the screen printing is performed using the metal mask, in the same manner as the case where the screen printing is performed using the screen mask, the piezoelectric/electrostrictive body in a paste form can be subjected to screen printing at the center portion using a first metal mask whose non-center portion is filled and whose center portion is an opening, and then the piezoelectric/electrostrictive body in a paste form can be subjected to screen printing at the non-center portion using a second metal mask whose center portion is filled and whose non-center portion is an opening.

FIG. 11 to FIG. 15 are schematic views of metal masks 7a to 7e, respectively, which can be used as this second metal mask. FIG. 11 to FIG. 15 are perspective views of the metal masks 7a to 7e, respectively.

Figure 11:
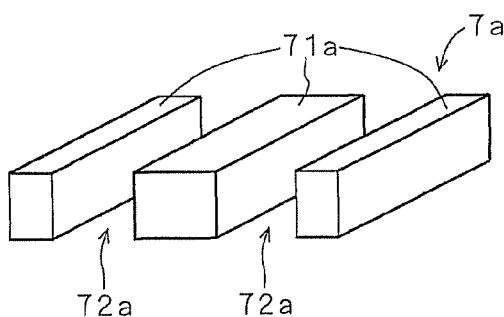
FIG. 11 is a perspective view of a metal mask.

As shown in FIG. 11, the metal mask 7a has a structure in which an opening 72a is formed in a metal plate 71a having substantially uniform plate thickness. The opening 72a is formed at a non-center portion which is opposed to, in the screen printing, a part in which the film thicknesses of the piezoelectric/electrostrictive films 116 and 120 are larger than the antinode of the bending first mode.

Figure 12:
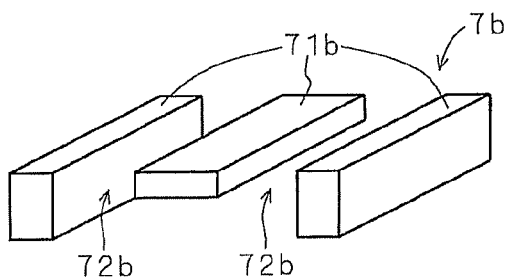
FIG. 12 is a perspective view of a metal mask.

As shown in FIG. 12, a metal mask 7b has a structure in which an opening 72b is formed in a metal plate 71b in which a plate thickness is smaller at a center portion than at a non-center portion. The opening 72b is formed at the non-center portion which is opposed to, in the screen printing, a part in which the film thicknesses of the piezoelectric/electrostrictive films 116 and 120 are larger than the antinode of the bending first mode. According to the metal mask 7b shown in the perspective view of FIG. 12, a paste of a piezoelectric/electrostrictive body which has infiltrated from the non-center portion being the opening 72b can flow into the center portion blocked by the metal plate 71b. Accordingly, continuity of the film thicknesses of the piezoelectric/electrostrictive films 116 and 120 to be formed is likely to be ensured.

Further, it is desirable to use the metal masks 7c to 7e to which emulsion layers 73c to 73e are added on printing surfaces of metal plates 71c to 71e, respectively.

Figure 13:
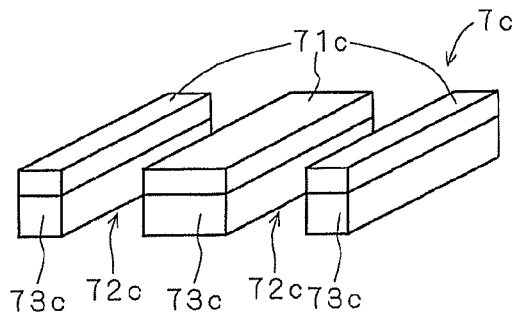
FIG. 13 is a perspective view of a metal mask.

As shown in FIG. 13, the metal mask 7c has a structure in which the emulsion layer 73c is added on the printing surface of the metal plate 71c having the substantially uniform plate thickness and an opening 72c is formed. The opening 72c is formed at a non-center portion which is opposed to, in the screen printing, a part in which the film thicknesses of the piezoelectric/electrostrictive films 116 and 120 are larger than the antinode of the bending first mode. The emulsion layer 73c is added to the entire non-opening portion except for the opening 72c on the printing surface side of the metal plate 71c.

As shown in FIG. 14, the metal mask 7d has a structure in which the emulsion layer 73d is added to a metal plate 71d having the substantially uniform plate thickness and an opening 72d is formed. The opening 72d is formed at the non-center portion which is opposed to, in the screen printing, a part in which the film thicknesses of the piezoelectric/electrostrictive films 116 and 120 are larger than the antinode of the bending first mode. The emulsion layer 73d is added to the entire non-opening except for the opening 72d on the printing surface side of the metal plate 71d.

As shown in FIG. 15, the metal mask 7e has a structure in which the emulsion layer is added to the metal plate 71e having the substantially uniform plate thickness and an opening portion 72e is formed. The opening portion 72e is formed at the non-center portion which is opposed to, in the screen printing, a part in which the film thicknesses of the piezoelectric/electrostrictive films 116 and 120 are larger than the antinode of the bending first mode. The emulsion layer 73e is added only to a non-center portion occupying a part of a non-opening portion except for the opening portion 72e on the printing surface side of the metal plate 71e.

The emulsion layers 73c to 73e, which are softer than the metal plates 71c to 71e, respectively, are added on the printing surface side in this manner, whereby the hard metal plate 71c to 71e are not brought into contact with the film forming surface, but the soft emulsion layers 73c to 73e are brought into contact with the film forming surface. Accordingly, it is possible to improve adhesion between the metal masks 7c to 7e and the film forming surface.

With the use of the printing plate which is typified by those screen masks 5 and 6 and metal masks 7a to 7e, in which the part opposed to, in the screen printing, the part in which the film thicknesses of the piezoelectric/electrostrictive films 116 and 120 are larger than the antinode of the bending first mode is an opening, the piezoelectric/electrostrictive films 116 and 120 can be formed without difficulty.

(Formation of Piezoelectric/Electrostrictive Film by Removing Unnecessary Piezoelectric/Electrostrictive Body Through Etching)

In order to form the piezoelectric/electrostrictive films 116 and 120 having the above-mentioned film thickness distribution by the sol-gel method, a sol-gel solution of the piezoelectric/electrostrictive body may be applied onto the film forming surface with the convex center portion, and then an unnecessary piezoelectric/electrostrictive body may be removed by etching.

(Experiments)

The following description will be given of, with reference to a flowchart of FIG. 16, results obtained by manufacturing the piezoelectric/electrostrictive element 1 shown in FIG. 1 and FIG. 2 while variously changing the film thickness distribution of the piezoelectric/electrostrictive films 116 and 120, and evaluating the manufactured piezoelectric/electrostrictive element 1.

In manufacturing the piezoelectric/electrostrictive element 1, first, the substrate 102 was manufactured (Step S101). The substrate 102 was manufactured by subjecting a ceramic green laminate in which ceramic green sheets of partially stabilized zirconium oxide were laminated to firing at 1,450° C.

Subsequently, the laminate 108 was formed on the thin portion 104 of the substrate 102 (Steps S102 to S109).

In forming the laminate 108, first, a lower layer electrode paste containing a powder of platinum and a powder of titanium oxide was applied onto the thin portion 104 by the screen printing method (Step S102), and then the formed lower layer electrode film 112 was subjected to firing at 1,300° C. (Step S103). Accordingly, a sintered body of the lower layer electrode film 112 integrated with the substrate 102 was obtained.

Subsequently, a piezoelectric/electrostrictive paste containing a calcined powder of a piezoelectric/electrostrictive material, an inner layer electrode paste containing a powder of platinum and a piezoelectric/electrostrictive paste were successively applied by the screen printing method (Steps S104 to S106), and then the formed lower layer piezoelectric/electrostrictive film 116, inner layer electrode film 118, upper layer piezoelectric/electrostrictive film 120 were subjected to cofiring at 1,250° C. (Step S107). Accordingly, the sintered body of the lower layer piezoelectric/electrostrictive film 116, the inner layer electrode film 118 and the upper layer piezoelectric/electrostrictive film 120, which was integrated with the substrate 102 and the lower layer electrode film 112, was obtained. As the piezoelectric/electrostrictive material, 20Pb$(Mg_{0.87/3}Ni_{0.13/3}Nb_{2/3})O_3$-43PbTiO$_3$-37PbZrO$_3$ was used.

Subsequently, an upper layer electrode paste containing a gold powder was applied by the screen printing method (Step S108), and then the formed upper layer electrode film 114 was subjected to firing at 800° C. (Step S109). Accordingly, a sintered body of the upper layer electrode film 114 was obtained.

In the formation of the laminate 108, as a pattern in plan view of the lower layer electrode film 112, the lower layer piezoelectric/electrostrictive film 116, the inner layer electrode film 118, the upper layer piezoelectric/electrostrictive film 120 and the upper layer electrode film 114, there was used a pattern in which the lower layer electrode film 112 and the upper layer electrode film 114 electrically have the same potential, the lower layer electrode film 112 and the inner layer electrode film 118 are opposed to each other with the lower layer piezoelectric/electrostrictive film 116 being sandwiched therebetween, and the inner layer electrode film 118 and the upper layer electrode film 114 are opposed to each other with the upper layer piezoelectric/electrostrictive film 120 being sandwiched therebetween. Further, the film thicknesses and widths of the lower layer electrode film 112, the inner layer electrode film 118 and the upper layer electrode film 114 in the application of the lower electrode paste, the inner layer electrode paste and the upper layer electrode paste were adjusted so that, after firing, the film thickness thereof were 1.0 to 2.0 µm, 1.0 to 1.5 µm, and 0.1 to 0.4 µm, respectively, and widths (lengths in a short side direction) thereof were 140 µm. Moreover, the film thicknesses of the lower layer piezoelectric/electrostrictive film 116 and the upper layer piezoelectric/electrostrictive film 120 in the application of the piezoelectric/electrostrictive paste were adjusted so that average film thicknesses thereof after firing were 6.5 µm and 7.0 µm, respectively.

After the formation of the laminate 108, a voltage of 100 V was applied between the outer layer electrode film 110 and the inner layer electrode film 118 at a temperature of 60° C., to thereby perform poling of the piezoelectric/electrostrictive element 1 (Step S110).

Then, a displacement amount of bending displacement was measured. The displacement amount was obtained by measuring a displacement amount when a driving voltage of 30 V was applied between the inner layer electrode film 118 and the outer layer electrode film 110 using a laser Doppler displacement meter. Further, a bias voltage of 30 V was applied to the piezoelectric/electrostrictive element 1 at high humidity for 30 hours, and presence/absence of dielectric breakdown was checked with an optical microscope of a magnification of 150 times. In consideration of a fact that a circular crack of approximately 20 µm in diameter was observed in the piezoelectric/electrostrictive element 1 in which dielectric breakdown actually regarded as a problem has occurred, the presence/absence of dielectric breakdown was determined from whether or not such crack was observed.

In Inventive Examples 1 to 18 of tables shown in FIG. 17 to FIG. 20, evaluation results of displacement amounts and insulating properties of the piezoelectric/electrostrictive element 1, in which the film thickness distribution of the piezoelectric/electrostrictive films 116 and 120 was variously changed within the scope of the present invention, are shown. In Comparative Examples 1 and 2 of the tables shown in FIG. 17 to FIG. 20, evaluation results of displacement amounts and insulating properties of the piezoelectric/electrostrictive element 1, in which the film thickness distribution of the piezoelectric/electrostrictive films 116 and 120 was out of the scope of the present invention, are shown. The "displacement amount" shown in FIG. 17 to FIG. 20 is an average value of thirty or more piezoelectric/electrostrictive elements. Measurement variation of displacement amount is roughly ±0.001 µm. In a column of "insulating properties", "○" represents that the dielectric breakdown has not occurred in the entire piezoelectric/electrostrictive films 116 and 120, and "x" represents that the dielectric breakdown has occurred in any spot of the piezoelectric/electrostrictive films 116 and 120. Note that "Δ" represents that the dielectric breakdown has not occurred at the edge portion of the operating region 194.

(As to Film Thickness at Edge Portion of Operating Region)

Inventive Examples 1 to 7 of FIG. 17 show, as to the piezoelectric/electrostrictive element 1 in which the film thicknesses of the lower layer piezoelectric/electrostrictive film 116 and the upper layer piezoelectric/electrostrictive layer 120 become the largest at an edge portion A of the operating region 194, evaluation results of displacement amounts and insulating properties in a case where the film thicknesses TA of the lower layer piezoelectric/electrostrictive film 116 and the upper layer piezoelectric/electrostrictive film 120 at the edge portion A of the operating region 194 are changed while keeping constant film thicknesses TE of the lower layer piezoelectric/electrostrictive film 116 and the upper layer piezoelectric/electrostrictive film 120 at a center portion E of the bending vibration region 182. In addition, Comparative Example 1 of FIG. 17 shows, as to a piezoelectric/electrostrictive element in which the film thicknesses TA at the edge portion A of the piezoelectric/electrostrictive elements 1 of Inventive Examples 1 to 7 are made to be smaller than the film thicknesses TE at the center portion E, evaluation results of a displacement amount and insulating properties. Here, the film thickness TA at the edge portion A, which is shown in FIG. 17, represents a relative value in a case where the film thickness TE at the center portion E is "1" being a reference value. This is similar in FIG. 18 to FIG. 20 described below. The operating region in the present invention refers to a region which is substantially conducive to driving. Therefore, the edge portion A shown in the drawings of the present invention is indicated by a perpendicular drawn from an edge of an electrode of an anode and a cathode opposed to each other, which is shorter than the other electrode, to the other electrode.

Figure 22:
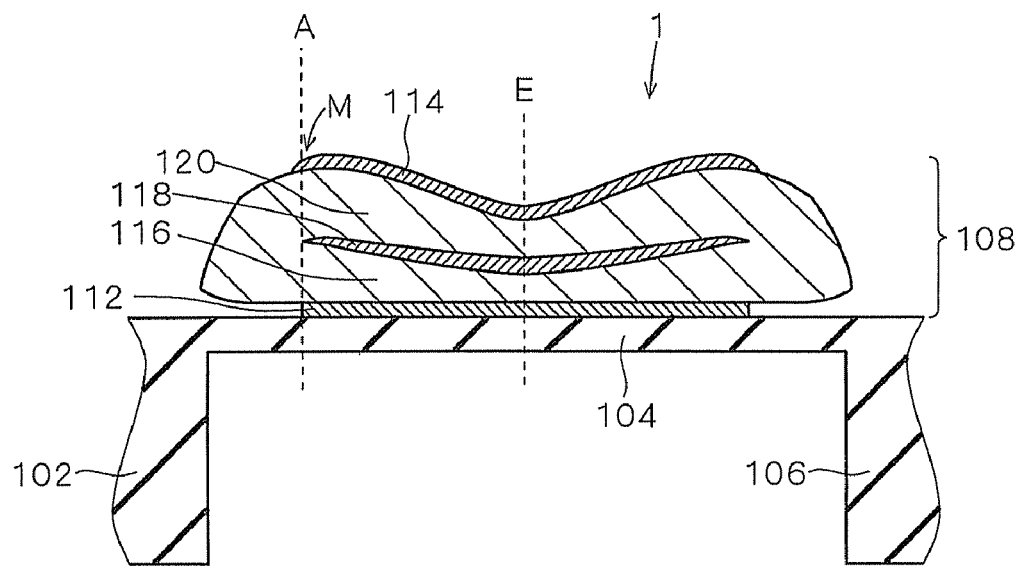
FIG. 22 is a cross-sectional view of the piezoelectric/electrostrictive element.

As shown in FIG. 17, in Comparative Example 1 in which a thickness ratio TA/TE which is a ratio of the film thickness TA at edge portion A to the film thickness TE at the center portion E is 0.70, the displacement amount is 0.328 µm. On the other hand, in Inventive Examples 1 to 7 in which the thickness ratio TA/TE is from 1.01 to 4.00 (see FIG. 22), the displacement amount is increased to 0.344 to 0.362 µm. In particular, in Inventive Examples 1 to 6 in which the thickness ratio TA/TE is from 1.01 to 3.00, the displacement amount is increased by large amount to 0.355 to 0.362 µm, and hence dielectric breakdown in the entire piezoelectric/electrostrictive films 116 and 120 can be prevented. That is, in order to increase the displacement amount, the thickness ratio TA/TE is desirably 1.01 or more, and more desirably, is from 1.01 to 3.00. In order to prevent the dielectric breakdown in the entire piezoelectric/electrostrictive films 116 and 120, the thickness ratio TA/TE is desirably from 1.01 to 3.00.

(As to Film Thickness at Center Portion of Bending Vibration Region)

Inventive Examples 8 to 14 of FIG. 18 show, as to the piezoelectric/electrostrictive element 1 in which the film thickness of the upper layer piezoelectric/electrostrictive film 120 is the largest at a middle point C between the edge portion A and the center portion E, evaluation results of displacement amounts and insulating properties in a case where a film thickness TC of the upper layer piezoelectric/electrostrictive film 120 at the middle point C is changed while keeping constant the film thickness TA of the upper layer piezoelectric/electrostrictive film 120 at the edge portion A and the film thickness TE of the upper layer piezoelectric/electrostrictive film 120 at the center portion E. In Inventive Examples 8 to 14, the film thickness of the lower layer piezoelectric/electrostrictive film 116 is the largest at the edge portion A of the operating region 194. In a case where the film thickness of the lower layer piezoelectric/electrostrictive film 116 at the center portion E is "1" being the reference value, the film thickness of the lower layer piezoelectric/electrostrictive film 116 at the edge portion A is "1.5".

Figure 23:
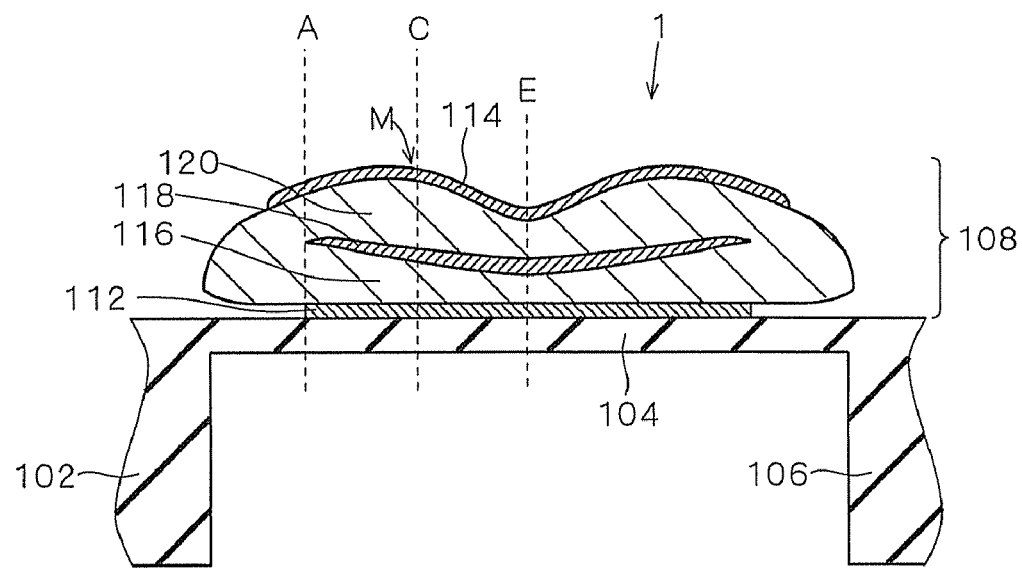
FIG. 23 is a cross-sectional view of the piezoelectric/electrostrictive element.

As shown in FIG. 18, in Inventive Examples 8 to 13 in which a thickness ratio TC/TE which is a ratio of a film thickness TC at the middle point C to the film thickness TE at the center portion E is from 1.01 to 3.00 (see FIG. 23), the displacement amount is increased from 0.328 µm of Comparative Example 1 to 0.340 to 0.352 µm, and sufficient insulating properties are obtained as well. However, in Inventive Example 14 in which the thickness ratio TC/TE is 4.00 (see FIG. 23), the displacement amount tends to decrease, and the dielectric breakdown tends to occur at a portion other than the edge portion A as well. That is, in order to increase the displacement amount and insulating properties to prevent dielectric breakdown in the entire piezoelectric/electrostrictive films 116 and 120, the thickness ratio TM/TE is desirably made to be 1.01 to 3.00.

(As to Position of Largest Film Thickness Point M)

Inventive Examples 3, 15, 10 and 16 of FIG. 19 show, as to the piezoelectric/electrostrictive element 1 in which a thickness ratio TM/TE which is a ratio of the largest value TM of the film thickness of the upper layer piezoelectric/electrostrictive film 120 to the film thickness TE of the upper layer piezoelectric/electrostrictive film 120 at the center portion E is 1.5, evaluation results of displacement amounts and insulating properties in a case where the largest film thickness point M in which the film thickness of the upper layer piezoelectric/electrostrictive film 120 is the largest is moved between the edge portion A and the center portion E. Also in Inventive Examples 3, 15, 10 and 16, the film thickness of the lower layer piezoelectric/electrostrictive film 116 is the largest at the edge portion A of the operating region 194. In a case where the film thickness of the lower layer piezoelectric/electrostrictive film 116 at the center portion E is "1" being the reference value, the film thickness of the lower layer piezoelectric/electrostrictive film 116 at the edge portion A is "1.5".

Figure 24:
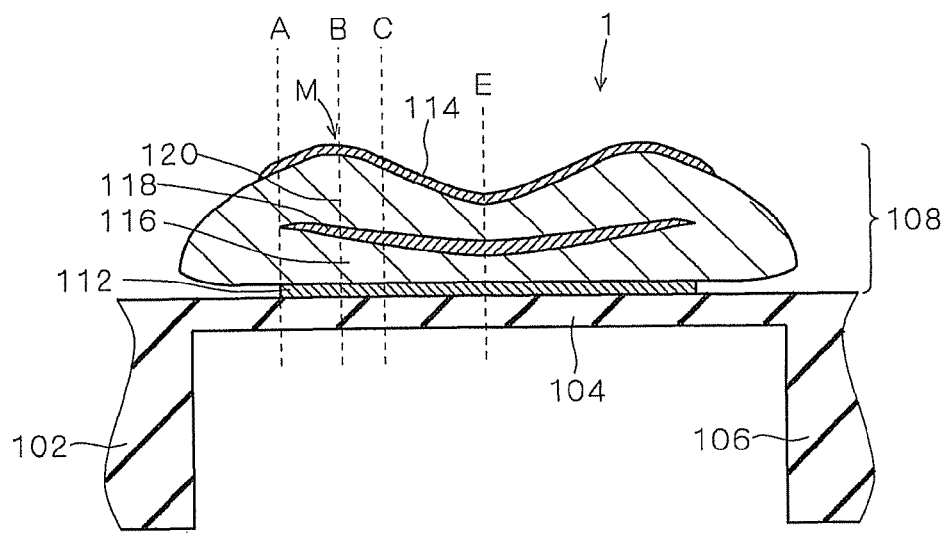
FIG. 24 is a cross-sectional view of the piezoelectric/electrostrictive element.
Figure 25:
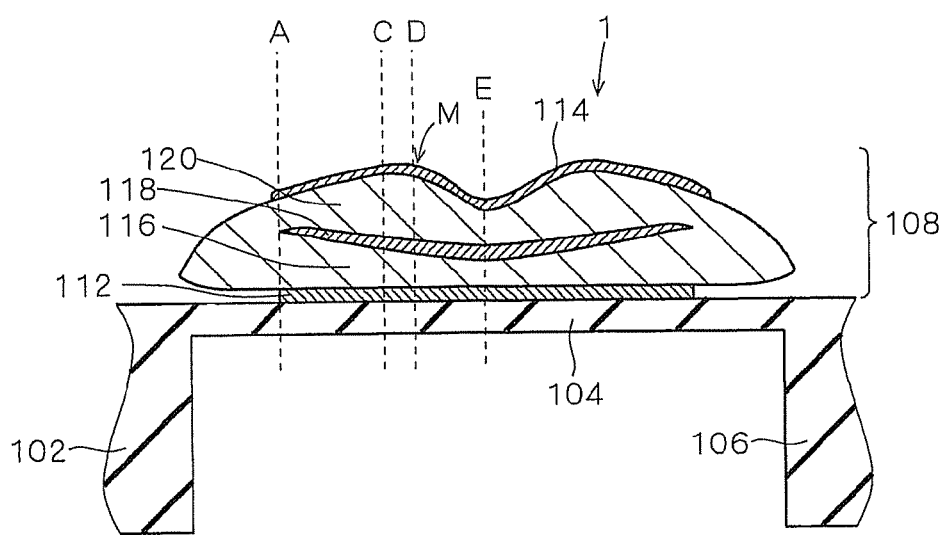
FIG. 25 is a cross-sectional view of the piezoelectric/electrostrictive element.

As shown in FIG. 19, in Inventive Example 3 in which the largest film thickness point M is positioned at the edge portion A (see FIG. 22), Inventive Example 15 in which the largest film thickness point M is positioned at a quadrant point B between the edge portion A and the middle point C (see FIG. 24), and Inventive Example 10 in which the largest film thickness point M is positioned at the middle point C (see FIG. 23), the displacement amount is increased from 0.328 μm of Comparative Example 1 to 0.345 to 0.358 μm, and sufficient insulating properties are obtained as well. However, in Inventive Example 16 in which the largest film thickness point M is positioned at a quadrant point D between the middle point C and the center portion E (see FIG. 25), the displacement amount tends to decrease, and insulating properties tend to become worse as well. That is, in order to increase the displacement amount and secure insulating properties, the largest film thickness point M is desirably positioned on the edge portion A side with respect to the middle point C.

(As to Film Thickness at Center Portion of Bending Vibration Region)

Inventive Examples 3 and 17 of FIG. 20 show, as to the piezoelectric/electrostrictive element 1 in which the film thickness of the upper layer piezoelectric/electrostrictive film 120 is the largest at the edge portion A, evaluation results of displacement amounts and insulating properties in a case where the film thickness TE of the upper layer piezoelectric/electrostrictive film 120 at the center portion E is changed while keeping constant the film thickness TA of the upper layer piezoelectric/electrostrictive film 120 at the edge portion A. In addition, Inventive Example 18 of FIG. 20 shows, as to the piezoelectric/electrostrictive element 1 in which the largest film thickness point M of the piezoelectric/electrostrictive element 1 of Inventive Example 17 is moved from the edge portion A to the middle point C, evaluation results of a displacement amount and insulating properties. Further, Comparative Example 2 of FIG. 20 shows, as to the piezoelectric/electrostrictive element in which the film thickness TA of the upper layer piezoelectric/electrostrictive film 120 at the edge portion A of the piezoelectric/electrostrictive element 1 is made to be smaller than the film thickness TE of the upper layer piezoelectric/electrostrictive film 120 at the center portion E thereof, evaluation results of a displacement amount and insulating properties. In Inventive Examples 3, 17 and 18 and Comparative Example 2, the film thickness of the lower layer piezoelectric/electrostrictive film 116 is the largest at the edge portion A of the operating region 194. When the film thickness of the lower layer piezoelectric/electrostrictive film 116 at the center portion E is "1" being the reference value, the film thickness of the lower layer piezoelectric/electrostrictive film 116 at the edge portion A is "1.5".

Figure 26:
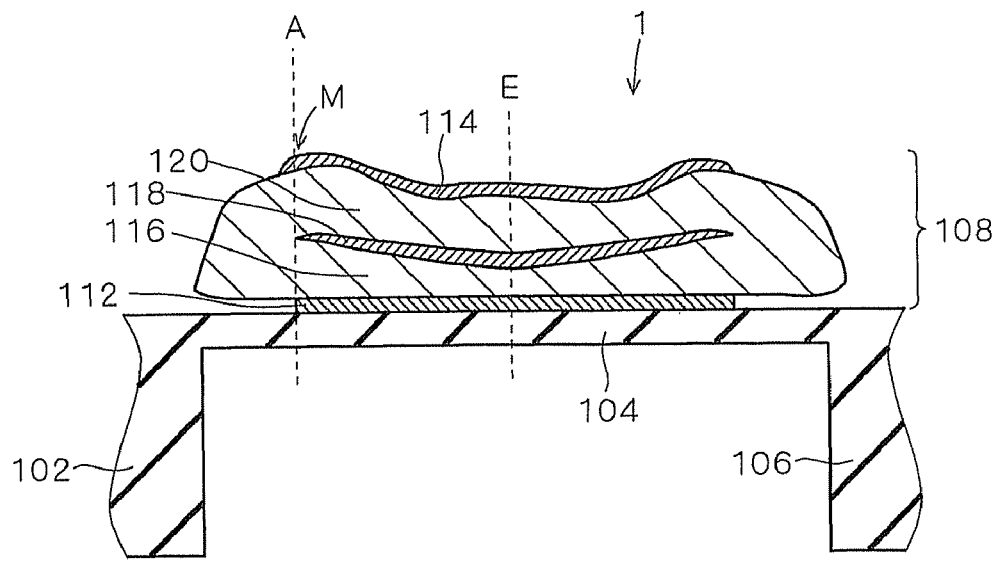
FIG. 26 is a cross-sectional view of the piezoelectric/electrostrictive element.
Figure 27:
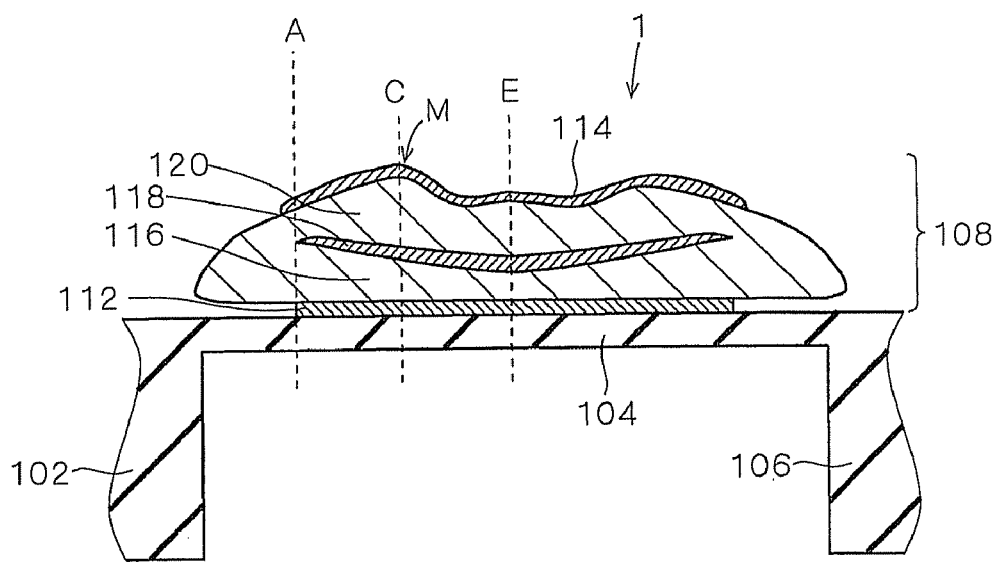
FIG. 27 is a cross-sectional view of the piezoelectric/electrostrictive element.
Figure 28:
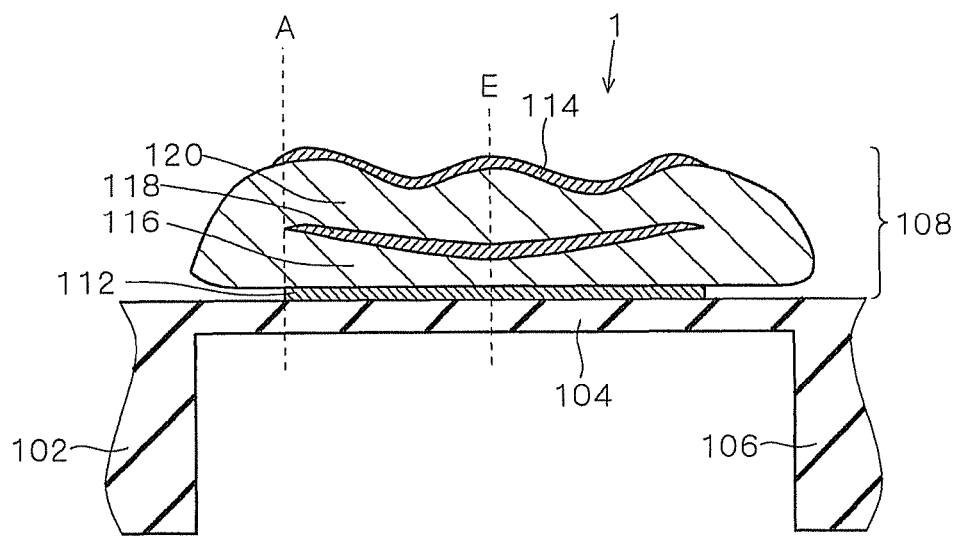
FIG. 28 is a cross-sectional view of the piezoelectric/electrostrictive element.

As shown in FIG. 20, in Inventive Example 3 in which the thickness ratio TA/TE which is the ratio of the film thickness TA at the edge portion A to the film thickness TE at the center portion E is 1.50 (see FIG. 22) and Inventive Example 17 in which the thickness ratio TA/TE is 1.10 (see FIG. 26), the displacement amount is increased from 0.224 μm of Comparative Example 2 in which the thickness ratio TA/TE is 0.8 (see FIG. 27) to 0.358 and 0.359 μm, and sufficient insulating properties are obtained as well. This is similar in Inventive Example 18 in which the largest film thickness point M is moved (see FIG. 28).

Note that FIG. 22 to FIG. 28 are schematic views of the piezoelectric/electrostrictive element 1 corresponding to FIG. 2.

Figure 29:
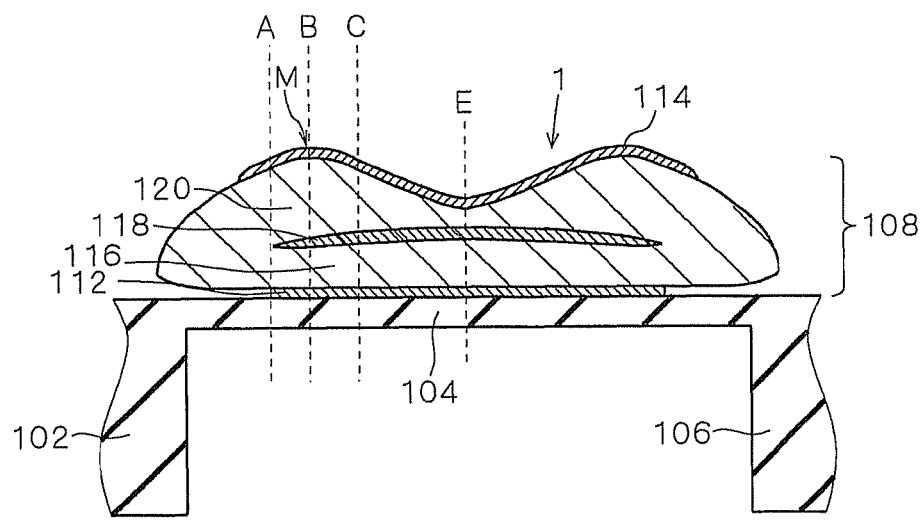
FIG. 29 is a cross-sectional view of the piezoelectric/electrostrictive element.
Figure 30:
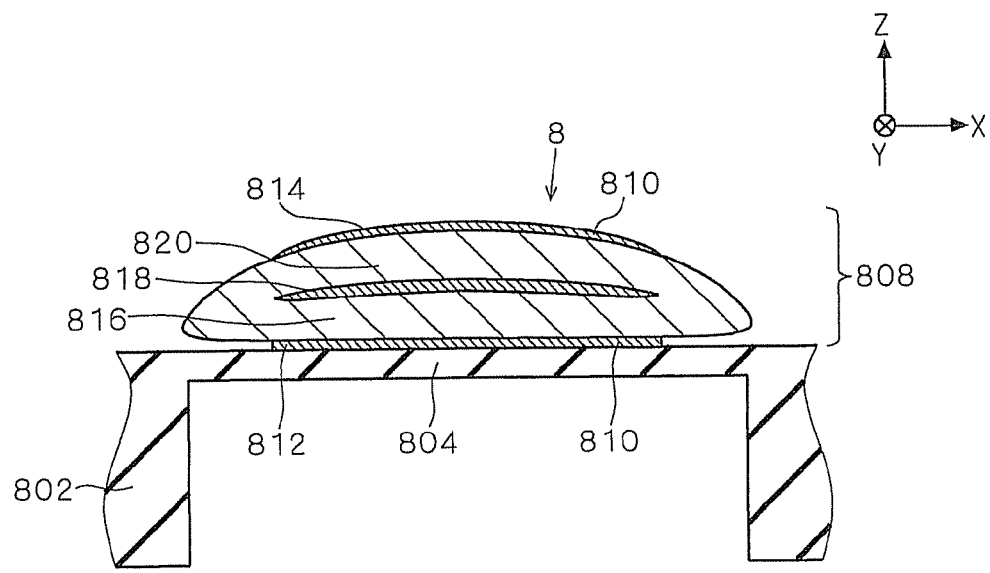
FIG. 30 is a cross-sectional view of a conventional piezoelectric/electrostrictive element.

Besides, as shown in a schematic view of the piezoelectric/electrostrictive element 1 of FIG. 29, also in a case where, as in a conventional piezoelectric/electrostrictive element 8, the lower layer piezoelectric/electrostrictive film 116 has film thickness distribution in which a film thickness becomes smaller in a continuous manner from the center portion E toward the edge portion A along the short side direction of the bending vibration region 182, where the upper layer piezoelectric/electrostrictive film 120 has film thickness distribution in which the film thickness is increased in a continuous manner from the center portion E toward the edge portion A along the short side direction of the bending vibration region 182, and where the largest film thickness point M is positioned at the quadrant point B, it is confirmed that a similar effect can be obtained as to the displacement amount and prevention of dielectric breakdown.

FIG. 21 shows, as to a piezoelectric/electrostrictive element in which a single-layer structure devoid of the inner layer electrode film 118 is used and the thickness ratio of the piezoelectric/electrostrictive film is variously changed, evaluation results of displacement amounts and insulating properties. As shown in FIG. 21, in Comparative Example 3 in which the thickness ratio is 0.7, which is beyond the scope of the present invention, the displacement amount is 0.166 μm. On the other hand, in Inventive Example 19 in which the thickness ratio is 1.01, which is within the scope of the present invention, the displacement amount is increased to 0.181 μm, and in Inventive Examples 20 to 26 in which the film thickness ratio is from 1.1 to 4.0, which are within the scope of the present invention, the displacement amount is further increased to 0.201 to 0.210 μm. Further, in Inventive Examples 19 to 24 in which the thickness ratio is 1.01 or more and 3.00 or less, sufficient insulating properties can be obtained as well. That is, also in the case of the single-layer structure, in order to increase the displacement amount, the thickness ratio is desirably made to be larger than 1, and more desirably, 1.1 and more. In order to prevent the dielectric breakdown in the entire piezoelectric/electrostrictive films 116 and 120, the thickness ratio is desirably made to be 1.01 or more and 3.0 or less.

While the invention has been shown and described in detail, the foregoing description is in all aspects illustrative and not limited thereto. It is therefore understood that numerous modifications and variations can be devised without departing from the scope of the invention. Particularly, it is naturally assumed to use a combination of the items described in each embodiment. Furthermore, it is assumed to use the piezoelectric/electrostrictive device such as a sensor other than the piezoelectric/electrostrictive actuator.

What is claimed is:

1. A piezoelectric/electrostrictive element, comprising:
   a substrate including a thin portion surrounded by a thick portion; and
   a laminate formed on said substrate, in which a piezoelectric/electrostrictive film and electrode films are laminated,
   wherein said thin portion and said laminate are subjected to bending vibration, and
   wherein along a short side direction of a bending vibration region being a direction of a straight line passing through an antinode of a bending first mode when said straight line crossing the bending vibration region has a smallest length, a part or all of said piezoelectric/electrostrictive film has film thickness distribution in which a portion having a larger film thickness than the antinode of the bending first mode between the antinode and a node of the bending first mode.

2. The piezoelectric/electrostrictive element according to claim 1, wherein along the short side direction of the bending vibration region, part or all of said piezoelectric/electrostrictive film has film thickness distribution so as to have a largest film thickness on an edge portion side of an operating region with respect to a middle point positioned between the antinode of the bending first mode and the edge portion of the operating region in which said electrode films are opposed to each other with said piezoelectric/electrostrictive film being sandwiched therebetween.

3. The piezoelectric/electrostrictive element according to claim 1, wherein along the short side direction of the bending vibration region, part or all of said piezoelectric/electrostrictive film has film thickness distribution so as to have a largest film thickness at an edge portion of an operating region in which said electrode films are opposed to each other with said piezoelectric/electrostrictive film being sandwiched therebetween.

4. The piezoelectric/electrostrictive element according to claim 1, wherein along the short side direction of the bending vibration region, part or all of said piezoelectric/electrostrictive film has film thickness distribution in which a ratio of a largest value of a film thickness to a smallest value thereof is 1.01 or more and 3.0 or less.

5. A piezoelectric/electrostrictive element, comprising:
   a substrate including a thin portion surrounded by a thick portion; and
   a laminate formed on said substrate, in which a piezoelectric/electrostrictive film and electrode films are laminated,
   wherein said thin portion and said laminate are subjected to bending vibration, and
   wherein along a short side direction of a bending vibration region being a direction of a straight line passing through an antinode of a bending first mode when said straight line crossing said bending vibration region has a smallest length, a part or all of said piezoelectric/electrostrictive film has film thickness distribution in which a portion in which a film thickness is larger than the antinode of the bending first mode is positioned between the antinode of the bending first mode and an edge portion of an operating region in which said electrode films are opposed to each other with said piezoelectric/electrostrictive film being sandwiched therebetween.

6. The piezoelectric/electrostrictive element according to claim 2, wherein along the short side direction of the bending vibration region, part or all of said piezoelectric/electrostrictive film has film thickness distribution in which a ratio of a largest value of a film thickness to a smallest value thereof is 1.01 or more and 3.0 or less.

7. The piezoelectric/electrostrictive element according to claim 3, wherein along the short side direction of the bending vibration region, part or all of said piezoelectric/electrostrictive film has film thickness distribution in which a ratio of a largest value of a film thickness to a smallest value thereof is 1.01 or more and 3.0 or less.

* * * * *

UNITED STATES PATENT AND TRADEMARK OFFICE
CERTIFICATE OF CORRECTION

| | | |
|---|---|---|
| PATENT NO. | : 7,911,113 B1 | Page 1 of 1 |
| APPLICATION NO. | : 12/552326 | |
| DATED | : March 22, 2011 | |
| INVENTOR(S) | : Hideki Shimizu, Shinji Shiranita and Takashi Ebigase | |

It is certified that error appears in the above-identified patent and that said Letters Patent is hereby corrected as shown below:

On the Title Page, please add:

Item (65), Prior Publication Data, US 2011/0050049 A1 Mar. 3, 2011

Signed and Sealed this
Tenth Day of May, 2011

David J. Kappos
*Director of the United States Patent and Trademark Office*